United States Patent
McHugh et al.

(10) Patent No.: US 6,758,691 B1
(45) Date of Patent: Jul. 6, 2004

(54) LAND GRID ARRAY CONNECTOR ASSEMBLY WITH SLIDING LEVER

(75) Inventors: Robert G. McHugh, Golden, CO (US); Hao-Yun Ma, Tu-chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/411,963

(22) Filed: Apr. 10, 2003

(51) Int. Cl.[7] .............................................. H01R 13/62
(52) U.S. Cl. ..................... 439/331; 439/73; 439/342
(58) Field of Search ........................ 439/331, 341–342, 439/73, 266, 259

(56) References Cited

U.S. PATENT DOCUMENTS

| | | |
|---|---|---|
| 5,192,213 A | 3/1993 | Kosugi et al. |
| 5,199,889 A | 4/1993 | McDevitt, Jr. |
| 5,232,372 A | 8/1993 | Bradley et al. |
| 5,320,559 A | 6/1994 | Uratsuji et al. |
| 5,362,241 A | 11/1994 | Matsuoka et al. |
| 6,086,387 A * | 7/2000 | Gallagher et al. ............ 439/71 |
| 6,485,320 B1 * | 11/2002 | Ma ............................ 439/342 |

* cited by examiner

*Primary Examiner*—Hae Moon Hyeon
(74) *Attorney, Agent, or Firm*—Wei Te Chung

(57) ABSTRACT

An electrical connector assembly (1) for electrically connecting an electronic package (2) with a circuit substrate (4). The connector assembly includes a socket (11), and a fastening device (10) surrounding the socket. The fastening device includes an insulative frame (13), and a lever (12) and a metal clip (14) respectively pivotably mounted to a first side (131) and a second side (132) of the frame. The first side of the frame defines a pair of guiding grooves (161). Each guiding groove is bounded in part by a lower arcuate wall (162) and an upper arcuate wall (163). The lever includes a pair of acting portions (123) movably received in the guiding grooves. When the lever is rotated from a vertical position down toward the clip, the acting portions of the lever slide from the lower walls to the upper walls.

17 Claims, 5 Drawing Sheets

LAND GRID ARRAY CONNECTOR ASSEMBLY WITH SLIDING LEVER

BACKGROUND OF THE INVENTION

1. Field of the Invention

The present invention relates to an electrical connector assembly for electrically connecting an electronic package such as a central processing unit (CPU) with a circuit substrate such as a printed circuit board (PCB), and particularly to a land grid array connector assembly having a fastening device for securely and reliably locating the CPU therein.

2. Description of Prior Art

An integrated circuit (IC) package having leads arranged in a land grid array (LGA) is known as an LGA package. LGA packages have relatively low height, which saves valuable space in electronic assemblies.

Connectors for removably mounting an LGA package on a PCB are known as LGA sockets. An LGA socket combined with ball grid array (BGA) technology typically comprises a thin and substantially flat insulative housing which is positioned between the LGA package and the PCB. The housing defines an array of passageways receiving electrical contacts therein. The contacts correspond with the array of leads of the LGA package. Each contact has a pair of opposite free ends that project beyond opposite top and bottom external surfaces of the housing. Prior to mounting of the LGA package on the PCB, the free ends are spaced apart a predetermined distance. The free ends are respectively engaged with corresponding contact pads on a bottom surface of the LGA package, and soldered to contact pads on a mounting surface of the PCB.

This kind of conventional LGA socket is detailed in "Nonlinear Analysis Helps Design LGA Connectors" (February 2001, Connector Specifier Journal). Similar kinds of LGA connectors are also disclosed in U.S. Pat. Nos. 5,192,213, 5,199,889, 5,232,372, 5,320,559 and 5,362,241.

FIGS. 9 and 10 show a conventional land grid array connector assembly 6 comprising a fastening device 60, and a socket 61 received in the fastening device 60. The fastening device 60 comprises a generally rectangular frame 63, and a lever 62 and a metal clip 64 respectively mounted to opposite sides of the frame 63. The frame 63 defines a pair of locating slots 66 at one side thereof, and a pair of guiding grooves 65 at an opposite side thereof. Each guiding groove 65 is bounded by a first wall 651 and an opposite second wall 652. The lever 62 comprises a pair of locating portions 623 pivotally received in the locating slots 66 of the frame 63, a driving portion 621 disposed between and offset from the locating portions 623, and a handle portion 622 bent perpendicularly from a distal end of one of the locating portions 623. The clip 64 comprises a pair of acting portions 641 movably received in the guiding grooves 65 of the frame 63, and a driving hook 644 formed at a free end thereof.

In use, the clip 64 is firstly rotated to be perpendicular to the frame 63, with the acting portions 641 disposed in the guiding grooves 65 close to the first walls 651. The handle portion 622 of the lever 62 is horizontal, and the driving portion 621 is at a highest position. A central processing unit (CPU) 7 is attached on the socket 61, and a copper plate 8 which functions as a heat dissipation device is attached on the CPU 7. The clip 64 is rotated down to a horizontal position, with a pair of pressing arms 643 and a pair of pressing pads 645 of the clip 64 abutting against the copper plate 8. The handle portion 622 of the lever 62 is rotated upwardly to be perpendicular to the frame 63, and the driving portion 621 of the lever 62 is received in the driving hook 644 of the clip 64. The handle portion 622 of the lever 62 is rotated down toward the clip 64, and the driving hook 644 is driven downwardly until the clip 64 is in a final pressing position firmly pressing the copper plate 8 on the CPU 7. However, as best seen in FIG. 10, during rotation of the clip 64, the acting portions 641 may simultaneously move along the guiding grooves 65 toward the second walls 652. When this happens, the driving hook 644 moves beyond its correct position. As a result, when the handle portion 622 of the lever 62 is rotated, the driving portion 621 of the lever 62 cannot be accurately received in the driving hook 644 of the clip 64 to drive it. This leads to the clip 64 not reaching its correct final pressing position. Thus, the clip 64 fails to properly secure the copper plate 8 and the CPU 7 on the socket 61.

In view of the above, a new land grid array connector assembly that overcomes the above-mentioned disadvantages is desired.

SUMMARY OF THE INVENTION

Accordingly, an object of the present invention is to provide an electrical connector assembly such as a land grid array (LGA) connector assembly for electrically connecting an electronic package such as a central processing unit (CPU) with a circuit substrate such as a printed circuit board (PCB), whereby the LGA connector assembly has a fastening device for securely and reliably locating the CPU in the LGA connector assembly.

Another object of the present invention is to provide a fastening device for an electrical connector such as an LGA socket to securely and reliably locate an electronic package such as a CPU in the LGA socket.

To achieve the above-mentioned objects, an LGA connector assembly in accordance with a preferred embodiment of the present invention is for electrically connecting a CPU with a PCB. The LGA connector assembly comprises a socket and a fastening device surrounding the socket. The fastening device comprises an insulative frame having a first side and a second side opposite to the first side, a lever pivotably assembled to the first side of the frame, and a metal clip pivotably mounted to the second side of the frame.

The frame forms a pair of guiding grooves at opposite ends of the first side. Each guiding groove is bounded in part by a lower wall and an upper wall. The lever comprises a pair of acting portions movably received in the guiding grooves, a driving portion disposed between and offset from the acting portions, and a handle portion bent perpendicularly from a distal end of one of the acting portions. The clip forms a driving hook at a free end thereof. The clip is rotated down from a perpendicular open position to a horizontal closed position. Then, the handle portion of the lever is rotated upwardly from a horizontal open position to a perpendicular position. The acting portions of the lever are rotated about the corresponding lower arcuate walls, and the driving portion is received in the driving hook of the metal clip. Then the handle portion of the lever is rotated down toward the metal clip, and the acting portions of the lever are driven to slide to reach the corresponding upper arcuate wall. The lever is at a final horizontal closed position, with the driving portion pressing the driving hook of the metal clip downwardly.

Other objects, advantages and novel features of the invention will become more apparent from the following detailed

DETAILED DESCRIPTION OF PREFERRED EMBODIMENTS OF THE INVENTION

Reference will now be made to the drawings to describe the present invention in detail.

Figure 1:
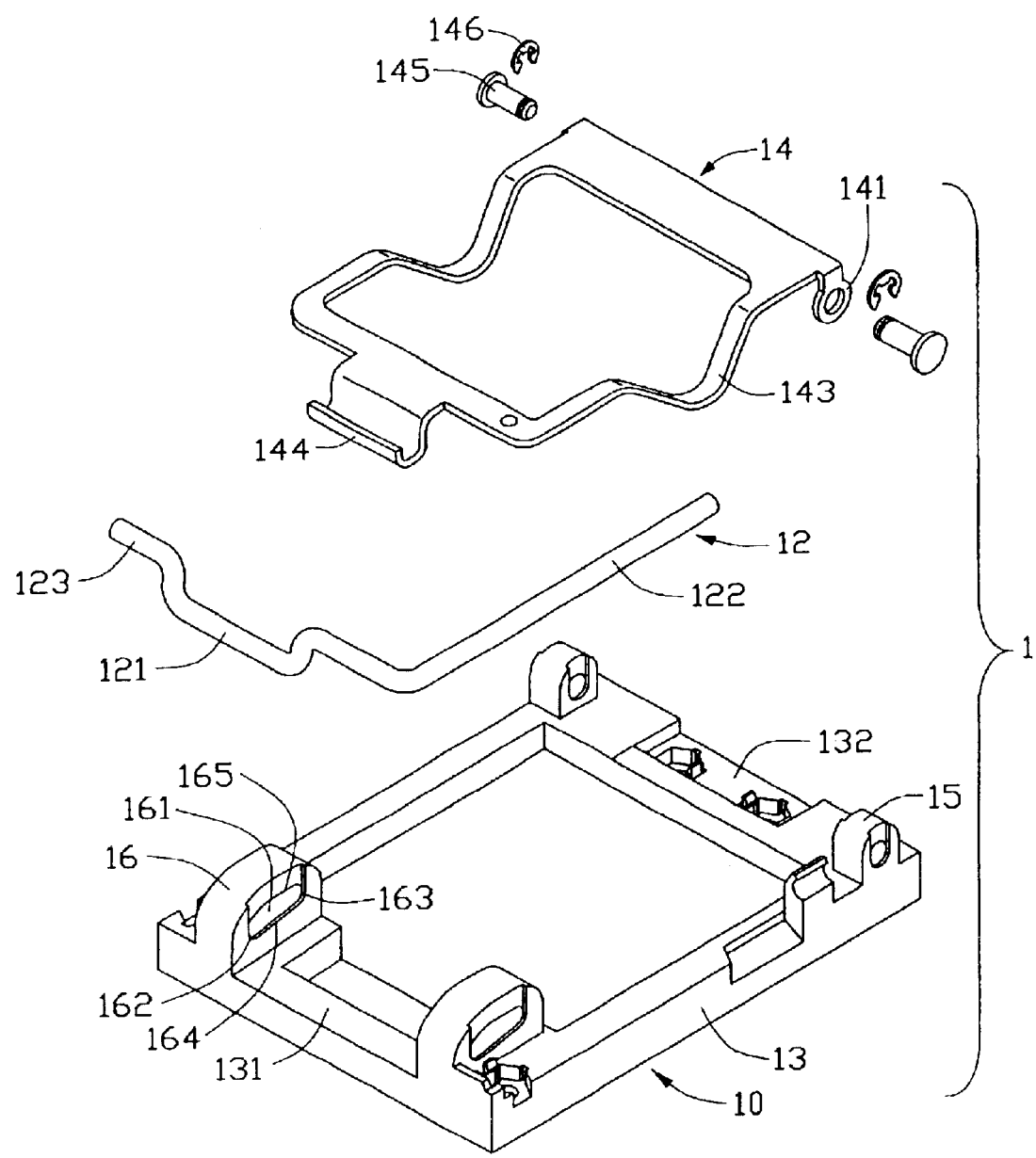
FIG. 1 is an exploded, isometric view of a land grid array connector assembly in accordance with a first preferred embodiment of the present invention.
Figure 2:
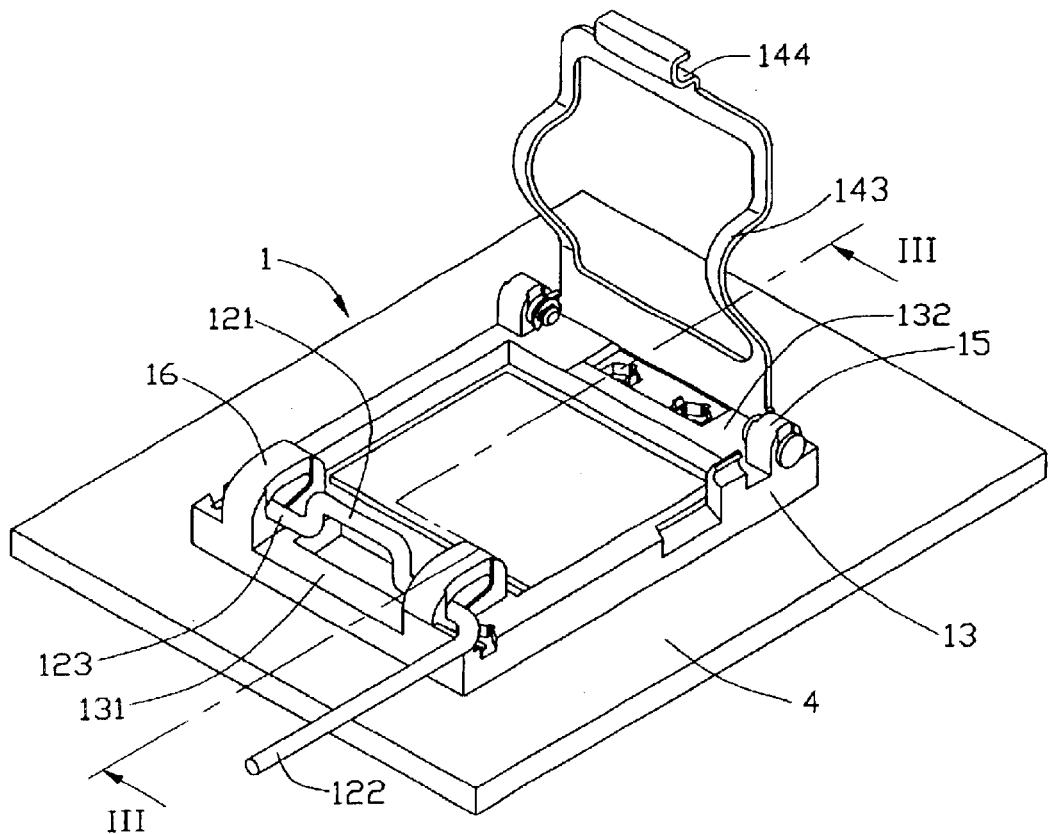
FIG. 2 is an isometric view of the connector assembly of FIG. 1 fully assembled and mounted on a PCB and having a CPU and a copper plate received therein, and showing a metal clip of the connector assembly at a vertical open position.
Figure 3:
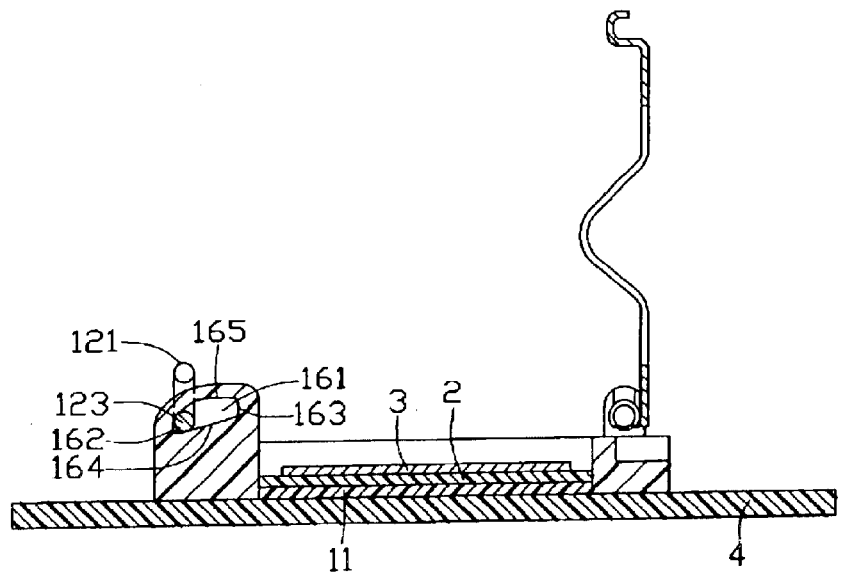
FIG. 3 is a cross-sectional view taken along line III—III of FIG. 2.

Referring to FIGS. 1, 2 and 3, a land grid array (LGA) connector assembly 1 in accordance with a first preferred embodiment of the present invention is for electrically connecting a central processing unit (CPU) 2 with a printed circuit board (PCB) 4. The LGA connector assembly 1 is mounted to the PCB 4, and comprises a socket 11 and a fastening device 10 surrounding the socket 11. The socket 11 has a plurality of LGA contacts provided therein. The fastening device 10 comprises an insulative frame 13 having a first side 131 and a second side 132 opposite to the first side 131, a lever 12 pivotably mounted to the first side of the frame 13, and a metal clip 14 pivotably mounted to the second side of the frame 13. The CPU 2 with a copper plate 3 attached thereon is assembled on the socket 11 and received in the frame 13.

The frame 13 forms a pair of spaced projections 16 at the first side 131 thereof. Each projection 16 defines a guiding groove 161 therein. Each groove 161 is bounded in part by a lower arcuate wall 162 and an upper arcuate wall 163. The upper arcuate wall 163 is disposed higher than the lower arcuate wall 162. The lower arcuate wall 162 and the upper arcuate wall 163 are interconnected by a slantwise straight bottom wall 164 and a slantwise arcuate top wall 165. The frame 13 also forms a pair of spaced locks 15 at the second side 132 thereof.

The lever 12 comprises a pair of acting portions 123 respectively received in the guiding grooves 161. The lever also comprises a driving portion 121 disposed between and offset from the acting portions 123, and a handle portion 122 bent perpendicularly from a distal end of one of the acting portions 123.

The metal clip 14 comprises a pair of locating portions 141 respectively pivotably secured in the locks 15 by bolts 145 and spring clips 146. Thus, the metal clip 14 is rotatably attached to the frame 13. The metal clip 14 also comprises a pair of opposite lateral pressing arms 143, and a driving hook 144 at a free end thereof generally between distal ends of the pressing arms 143.

Referring to FIGS. 2 and 3, in use, the metal clip 14 is rotated to be perpendicular to the frame 13 in a vertical open position. This enables the CPU 2 and the copper plate 3 to be put into the frame 13 and then attached on the socket 11. In the open position, the handle portion 122 of the lever 12 is horizontal, and the driving portion 121 is at a highest position. Further, the acting 123 of the lever 12 in the guiding grooves 161 abut the lower arcuate walls 162.

Figure 4:
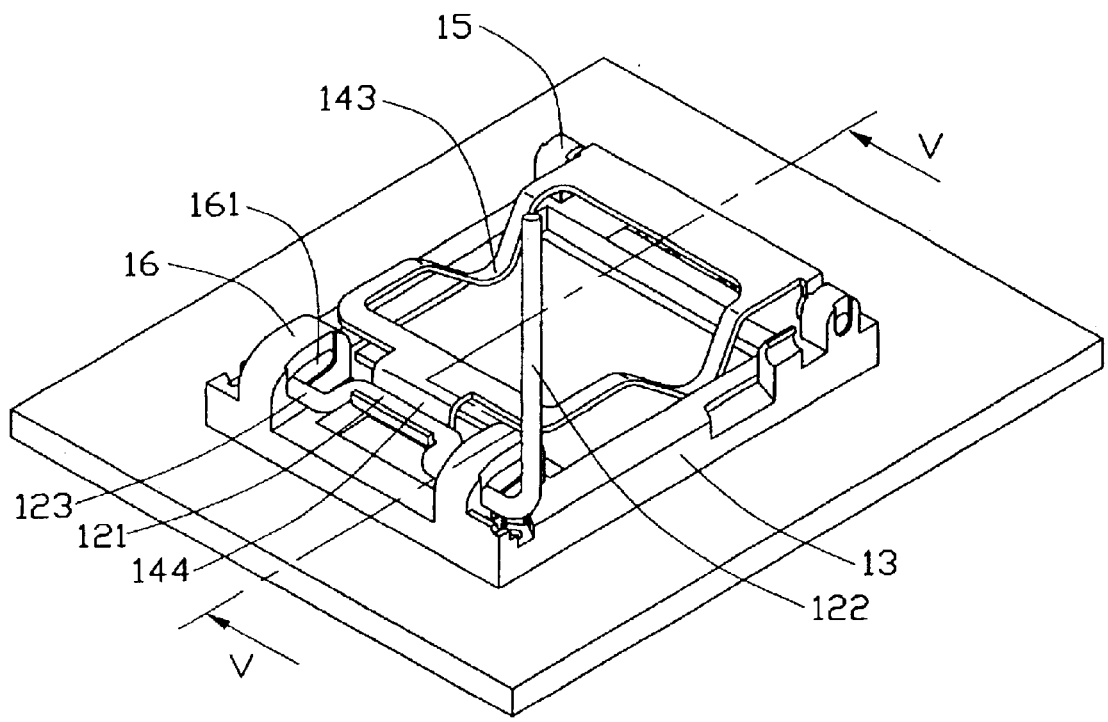
FIG. 4 is similar to FIG. 2, but showing the metal clip of the connector assembly at a horizontal closed position.
Figure 5:
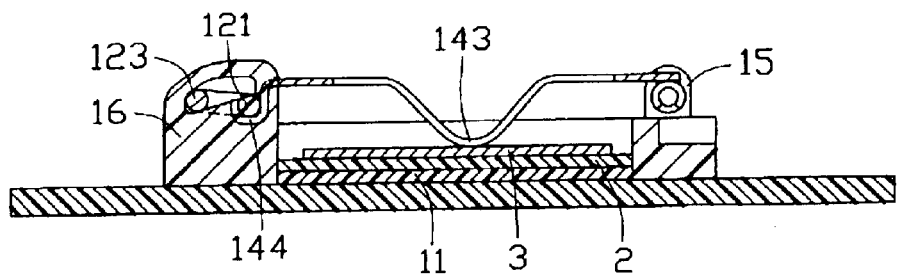
FIG. 5 is a cross-sectional view taken along line V—V of FIG. 4.

Referring to FIGS. 4 and 5, the metal clip 14 is then rotated to a horizontal closed position, with the pressing arms 143 abutting against the copper plate 3. The handle portion 122 of the lever 12 is rotated upwardly to be perpendicular to the frame 13, and the acting portion 123 of the lever 12 are thus rotated about the corresponding lower arcuate walls 162. In this position, the driving portion 121 is received in the driving hook 144 of the metal clip 14.

Figure 6:
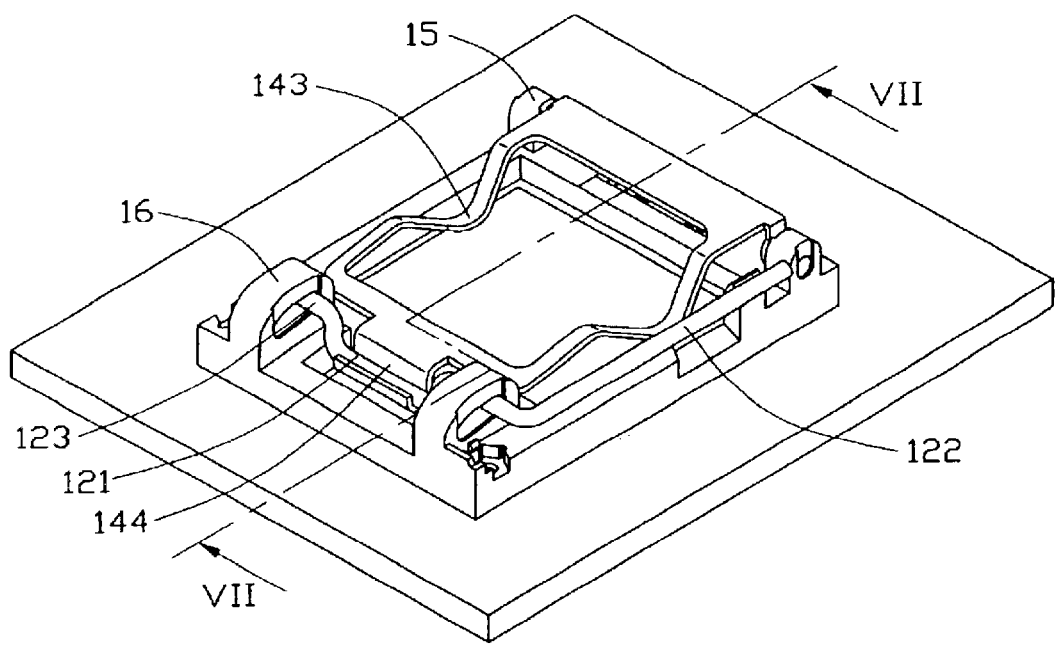
FIG. 6 is similar to FIG. 4, but showing the metal clip of the connector assembly pressing the copper plate and the CPU in the connector assembly.
Figure 7:
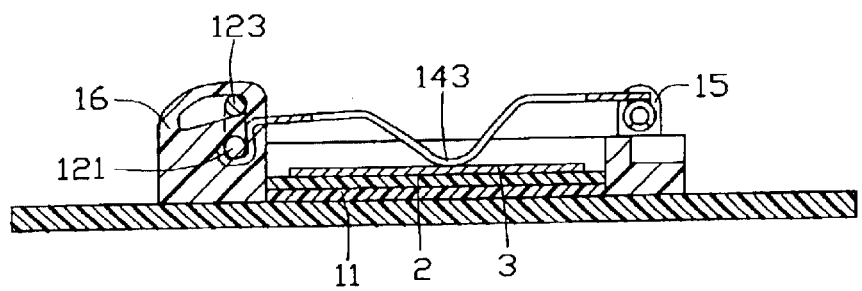
FIG. 7 is a cross-sectional view taken along line VII—VII of FIG. 6.

Referring to FIGS. 6 and 7, the handle portion 122 of the lever 12 is rotated down toward the metal clip 14, and the acting portions 123 of the lever 12 are driven to slide along the corresponding slantwise arcuate top walls 165 until they reach the corresponding upper arcuate walls 163. In this position, the lever 12 is at a final horizontal closed position, with the driving portion 121 at a lowest position pressing the driving hook 144 of the metal clip 14 downwardly. Accordingly, the pressing arms 143 of the metal clip 14 resiliently press the copper plate 3.

In the LGA connector assembly 1 of the present invention, the metal clip 14 is rotatably fixed at the second side 132 of the frame 13. During rotation of the metal clip 14, the metal clip 14 cannot slide toward the first side 131 of the frame 13. This ensures that the driving portion 121 of the lever 12 accurately engages in the driving hook 144 of the metal clip 14. Thus the metal clip 14 can reach a correct final pressing position so that it properly secures the copper plate 3 and the CPU 2 on the socket 11.

Figure 8:
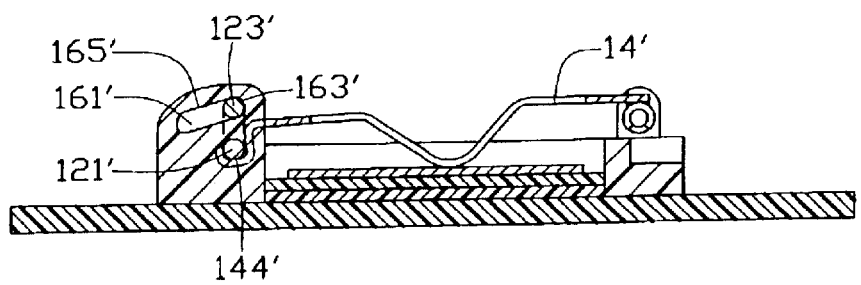
FIG. 8 is similar to FIG. 7, but showing a land grid array connector assembly in accordance with a second preferred embodiment of the present invention.
Figure 9:
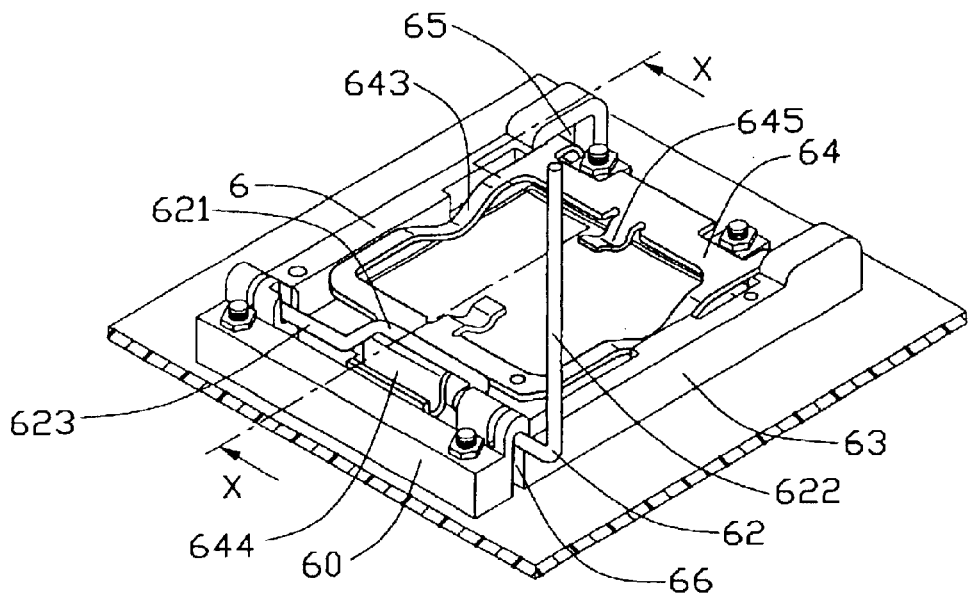
FIG. 9 is an isometric view of a conventional land grid array connector assembly mounted on a PCB and having a CPU and a copper plate received therein, and showing a metal clip of the connector assembly at a horizontal closed position.
Figure 10:
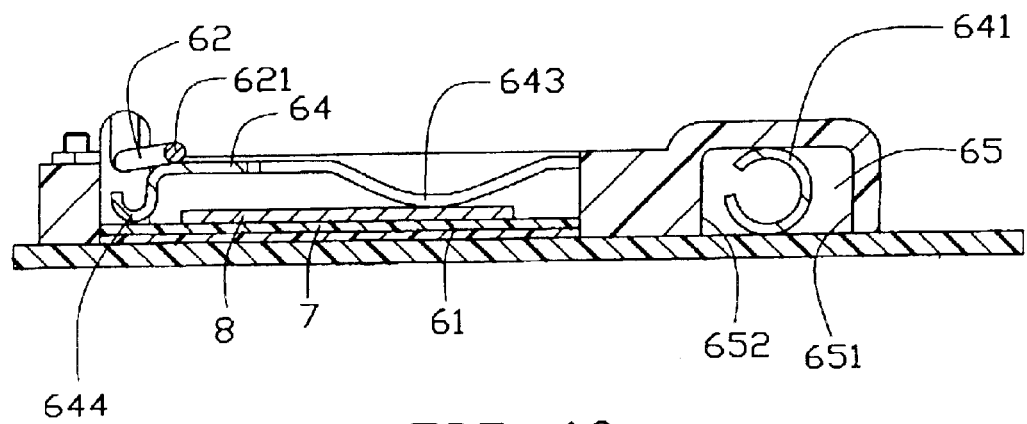
FIG. 10 is a cross-sectional view taken along line X—X of FIG. 9.

FIG. 8 shows a second preferred embodiment of a guiding groove 161' of the present invention. A top wall 165' at the guiding groove 161' has a slantwise straight configuration. When a handle portion (not shown) of a lever (not shown) is rotated from a perpendicular position toward a metal clip 14', each of acting portions 123' of the lever slides along the top wall 165' of the corresponding guiding groove 161' until the acting portion 123' reaches an upper arcuate wall 163' of the guiding groove 161' and is located thereat. Thus, the lever is at a final horizontal closed position with a driving portion 121' of the lever at a lowest position and pressing a driving hook 144' of the metal clip 14' downwardly.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector assembly for electrically connecting an electrical package with a circuit substrate, the electrical connector assembly comprising:

a socket;

a fastening device comprising a frame surrounding the socket, a lever pivotally mounted to a first side of the frame, and a metal clip pivotally mounted to an opposite second side of the frame;

the frame defining a pair of guiding grooves at opposite ends of the first side, and forming a pair of locks at opposite ends of the second side, each of the guiding grooves being bounded by a lower wall and an upper wall which are interconnected by a bottom wall and a top wall;

the lever comprising a pair of acting portions respectively received in the guiding grooves, a driving portion disposed between and offset from the acting portions, and a handle portion bent from a distal end of one of the acting portions; and the metal clip comprising a pair of locating portions respectively pivotally secured in the locks, and a driving hook provided at a free end thereof;

wherein the acting portions of the lever abut the corresponding lower walls in the guiding grooves when the lever is at a first position, the acting portions rotate about the lower walls when the lever is rotated to be generally perpendicular to the frame, and the acting portions slide along the top walls to reach the upper walls when the lever is rotated toward the metal clip.

2. The electrical connector assembly as claimed in claim 1, wherein the lower walls and the upper walls have arcuate configuration, and each of the upper walls is disposed higher than the corresponding lower wall.

3. The electrical connector assembly as claimed in claim 2, wherein the top walls have slantwise arcuate configurations.

4. The electrical connector assembly as claimed in claim 2, wherein the top walls have slantwise straight configurations.

5. The electrical connector assembly as claimed in claim 2, wherein the metal clip further comprises a pair of pressing arms generally between the two locating portions and the driving hook.

6. The electrical connector assembly as claimed in claim 5, wherein each of locating portions is pivotally secured in a corresponding lock of the frame by a bolt and a spring clip.

7. A fastening device for surrounding a socket, the fastening device comprising:

an insulative frame comprising a first side and a second side opposite to the first side, the frame defining a pair of guiding grooves at opposite ends of the first side and providing a pair of locks at opposite ends of the second side, each of the guiding grooves being bounded by a lower wall and an upper wall which arc interconnected by a bottom wall and a top wall;

a lever comprising a pair of acting portions respectively received in the guiding grooves, a driving portion disposed between and offset from the acting portions, and a handle portion bent from a distal end of the one of the acting portions; and a metal clip pivotally mounted to the second side of the frame;

wherein the acting portions of the lever abut the corresponding lower walls in the guiding grooves when the lever is at a first position, the acting portions rotate about the lower walls when the lever is rotated to be generally perpendicular to the frame, and the acting portions slide along the top walls to reach the upper walls when the lever is rotated toward the metal clip.

8. The fastening device as claimed in claim 7, wherein the metal clip comprises a pair of locating portions, a driving hook, and a pair of pressing arms provided between the two locating portions and the driving hook.

9. The fastening device as claimed in claim 8, wherein each of the locating portions is pivotally received in the corresponding lock of the frame by a bolt and a spring clip, and the driving hook is provided at a free end of the metal clip.

10. The fastening device as claimed in claim 9, wherein the lower walls and the upper walls have arcuate configurations, and each of the upper walls is disposed higher than the corresponding lower wall.

11. The fastening device as claimed in claim 9, wherein the top walls have slantwise arcuate configurations.

12. The fastening device as claimed in claim 10, wherein the top walls have slantwise straight configurations.

13. An assembly comprising:

a fastening device including a frame defining opposite first and second sides thereof along a direction;

a lever roughly pivotally mounted to the first side;

a clip pivotally mounted the second side;

at least a guiding groove defined in said first side and extending generally along said direction;

opposite first and second positions defined at two outermost ends of said guiding groove, said first position being farther away from the second side than said second position;

the lever including an action portion receivably movable along said guiding groove between the said first and second positions, and a driving portion radially offset from said action portion;

the clip including a driving hook located far away from the second side but close to the first side when said clip is in a horizontal position for latchable engagement with the driving portion; wherein when the action portion is located at the second position, the clip is in a tensioned manner for holding an electronic package in the frame while when the action portion is located at the first position, the clip is in a relaxed manner for disengaging said electronic package.

14. The assembly as claimed in claim 13, wherein when said action portion is located at the second position, the driving portion is located below said action portion while when the action portion is located at the first position, the driving portion is allowed to be located either closer to the second side than said action portion in said direction or above the action portion.

15. The assembly as claimed in claim 13, wherein said lever further includes a handle portion, said handle portion horizontally extending toward the second side when said action portion is located at the second position while rotatable between a vertical position and a horizontal position extending away from the second side when said action portion is located at the first position.

16. The assembly as claimed in claim 13, wherein said driving portion is axially offset from said action portion.

17. The assembly as claimed in claim 13, wherein said clip is pivot about a fixed axis.

* * * * *